(12) United States Patent
Lei et al.

(10) Patent No.: US 9,126,285 B2
(45) Date of Patent: *Sep. 8, 2015

(54) LASER AND PLASMA ETCH WAFER DICING USING PHYSICALLY-REMOVABLE MASK

(75) Inventors: Wei-Sheng Lei, San Jose, CA (US); Saravjeet Singh, Santa Clara, CA (US); Madhava Rao Yalamanchili, Morgan Hill, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 324 days.

This patent is subject to a terminal disclaimer.

(21) Appl. No.: 13/161,036

(22) Filed: Jun. 15, 2011

(65) Prior Publication Data

US 2012/0322237 A1    Dec. 20, 2012

(51) Int. Cl.
| | |
|---|---|
| H01L 21/28 | (2006.01) |
| B23K 26/06 | (2014.01) |
| H01L 21/78 | (2006.01) |
| H01L 21/308 | (2006.01) |
| H01L 21/311 | (2006.01) |

(Continued)

(52) U.S. Cl.
CPC ........... *B23K 26/0635* (2013.01); *B23K 26/367* (2013.01); *B23K 26/409* (2013.01); *B23K 26/4075* (2013.01); *H01L 21/3081* (2013.01); *H01L 21/31127* (2013.01); *H01L 21/78* (2013.01)

(58) Field of Classification Search
CPC ...... H01L 21/78; B23K 26/367; B23K 26/06; B23K 26/0626; B23K 26/063; B23K 26/0635

USPC .................. 438/694–696, 700–702, 460–465
See application file for complete search history.

(56) References Cited

U.S. PATENT DOCUMENTS

| | | |
|---|---|---|
| 4,049,944 A | 9/1977 | Garvin et al. |
| 5,593,606 A | 1/1997 | Owen et al. |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

International Search Report and Written Opinion from PCT/US2012/040303 mailed Dec. 28, 2012, 9 pgs.

(Continued)

*Primary Examiner* — Mohammad Islam
*Assistant Examiner* — John P Dulka
(74) *Attorney, Agent, or Firm* — Blakely Sokoloff Taylor Zafman LLP

(57) ABSTRACT

Methods of dicing semiconductor wafers, each wafer having a plurality of integrated circuits, are described. A method includes forming a mask above the semiconductor wafer. The mask covers and protects the integrated circuits. The mask is patterned with a laser scribing process to provide a patterned mask with gaps. The patterning exposes regions of the semiconductor wafer between the integrated circuits. The semiconductor wafer is then etched through the gaps in the patterned mask to form singulated integrated circuits. The patterned mask is then separated from the singulated integrated circuits.

15 Claims, 8 Drawing Sheets

(51) Int. Cl.
*B23K 26/36* (2014.01)
*B23K 26/40* (2014.01)

(56) References Cited

U.S. PATENT DOCUMENTS

| | | | |
|---|---|---|---|
| 6,057,180 | A | 5/2000 | Sun et al. |
| 6,174,271 | B1 | 1/2001 | Kosmowski |
| 6,306,731 | B1 | 10/2001 | Igarashi et al. |
| 6,407,363 | B2 | 6/2002 | Dunsky et al. |
| 6,465,158 | B1 | 10/2002 | Sekiya |
| 6,528,864 | B1 | 3/2003 | Arai |
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,639 | B2 | 3/2009 | Nakamura |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 * | 3/2011 | Arita et al. ............ 438/462 |
| 7,923,351 | B2 | 4/2011 | Arita |
| 7,927,973 | B2 | 4/2011 | Haji et al. |
| 8,642,448 | B2 * | 2/2014 | Lei et al. ............ 438/463 |
| 8,853,056 | B2 * | 10/2014 | Lei et al. ............ 438/463 |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2006/0024924 | A1 | 2/2006 | Haji et al. |
| 2006/0043535 | A1 | 3/2006 | Hiatt |
| 2006/0205182 | A1 | 9/2006 | Soejima |
| 2007/0272666 | A1 * | 11/2007 | O'Brien et al. ......... 219/121.69 |
| 2009/0020511 | A1 * | 1/2009 | Kommera et al. ....... 219/121.68 |
| 2009/0255911 | A1 | 10/2009 | Krishnaswami et al. |
| 2010/0013036 | A1 * | 1/2010 | Carey ................ 257/431 |
| 2010/0048001 | A1 | 2/2010 | Harikai et al. |
| 2010/0120227 | A1 | 5/2010 | Grivna et al. |
| 2010/0246611 | A1 | 9/2010 | Sun |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Linder, V., et al., "Water-Soluble Sacrificial Layers for Surface Micromachining," www.small-journal.com, 2005, 1, No. 7, 7 pgs.

Singh, Saravjeet, et al., "Apparatus and Methods for Dry Etch with Edge, Side and Back Protection," U.S. Appl. No. 61/491,693, filed May 31, 2011 24 pgs.

International Preliminary Report on Patentability dated Dec. 17, 2013, in International Patent Application No. PCT/US2012/040303 ; 6 pages.

* cited by examiner

LASER AND PLASMA ETCH WAFER DICING USING PHYSICALLY-REMOVABLE MASK

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits includes forming a mask above the semiconductor wafer, the mask covers and protects the integrated circuits. The mask is then patterned with a laser scribing process to provide a patterned mask with gaps, exposing regions of the semiconductor wafer between the integrated circuits. The semiconductor wafer is then etched through the gaps in the patterned mask to form singulated integrated circuits. The patterned mask is then separated from the singulated integrated circuits.

In another embodiment, a system for dicing a semiconductor wafer includes a factory interface. A laser scribe apparatus is coupled with the factory interface and includes a femtosecond-based laser. A plasma etch chamber is also coupled with the factory interface. A deposition chamber is also coupled with the factory interface. The deposition chamber is configured to form a physically-removable mask.

In another embodiment, a method of dicing a semiconductor wafer having a plurality of integrated circuits includes forming a physically-removable mask above a silicon substrate. The physically-removable mask covers and protects integrated circuits disposed on the silicon substrate. The integrated circuits are composed of a layer of silicon dioxide disposed above a layer of low K material and a layer of copper. The physically-removable mask, the layer of silicon dioxide, the layer of low K material, and the layer of copper are patterned with a laser scribing process to expose regions of the silicon substrate between the integrated circuits. The silicon substrate is then etched through the gaps to form singulated integrated circuits. The physically-removable mask is then separated from the singulated integrated circuits.

DETAILED DESCRIPTION

Methods of dicing semiconductor wafers, each wafer having a plurality of integrated circuits thereon, are described. In the following description, numerous specific details are set forth, such as physically-removable masks for laser scribing and plasma etching singulation processes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. A suitable mask for use with the laser scribe and plasma etch process may be a mask that does not interfere with either the laser scribe or the plasma etch processes, and that may be readily removed after performing both of the processes.

Integrated circuits included in or on wafers or substrates often include a top conductive bumps layer partially surrounded by a passivation layer, such as a polyimide layer. In accordance with an embodiment of the present invention, the passivation layer and bumps layer would otherwise be damage during a laser scribe and plasma etch singulation of the integrated circuits. Thus, a mask may be used above the passivation layer and bumps layer for protection during the laser scribe and plasma etch singulation of the integrated circuits. However, for packaging considerations, the mask may be removed following the singulation process. In an embodiment, the mask is a physically-removable mask, and is removed by a physical process such as a lift-off, roll-off, or peel-off process, as described in greater detail below. In one such embodiment, the physical removal process itself also does not damage the passivation or bumps layers.

Figure 1:
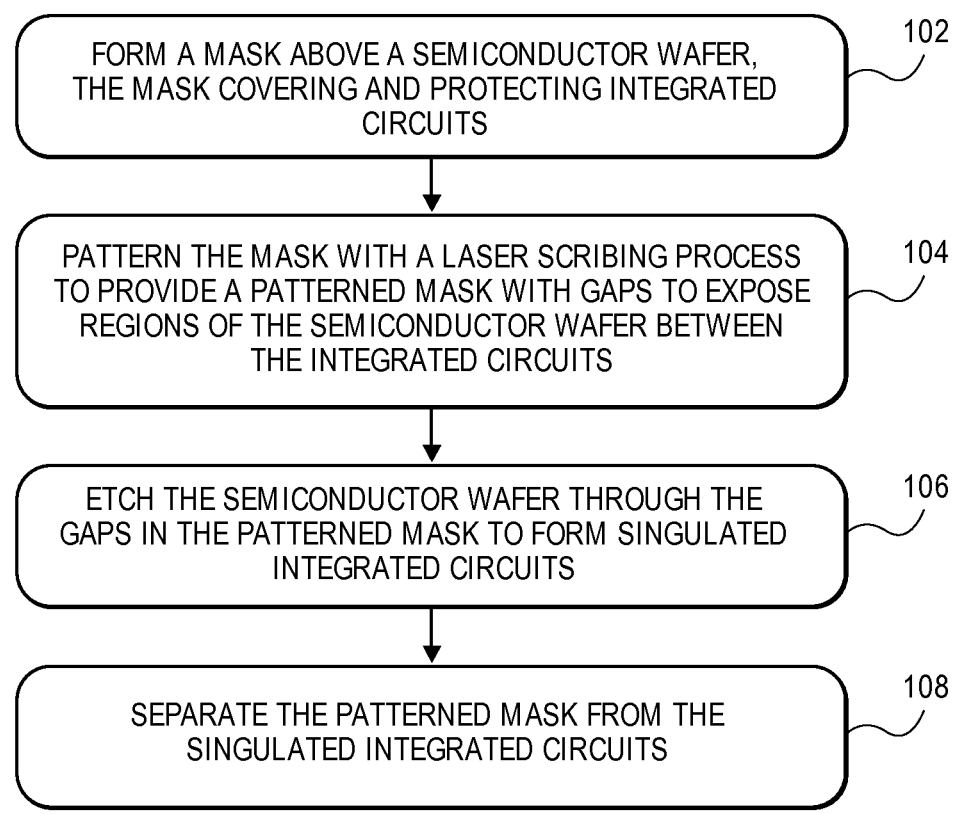
FIG. 1 is a Flowchart representing operations in a method of dicing a semiconductor wafer including a plurality of integrated circuits, in accordance with an embodiment of the present invention.
Figure 2A:
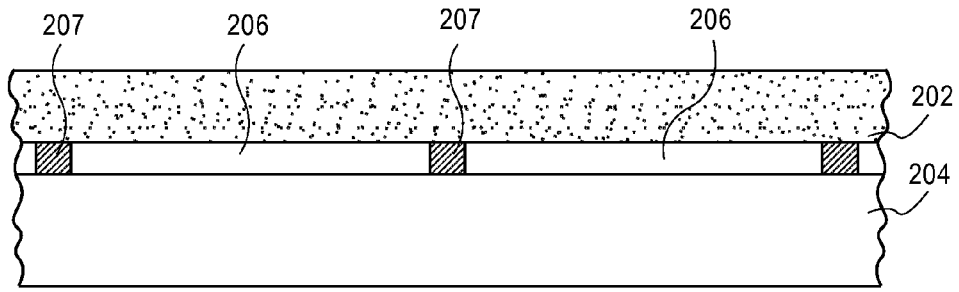
FIG. 2A illustrates a cross-sectional view of a semiconductor wafer including a plurality of integrated circuits during performing of a method of dicing the semiconductor wafer, corresponding to operation 102 of the Flowchart of FIG. 1, in accordance with an embodiment of the present invention.
Figure 2B:
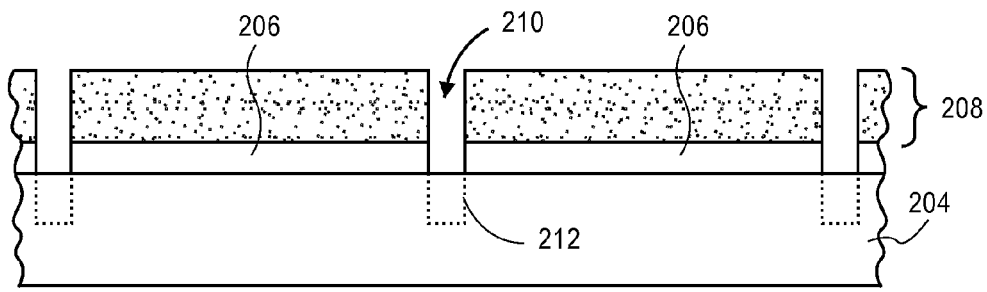
FIG. 2B illustrates a cross-sectional view of a semiconductor wafer including a plurality of integrated circuits during performing of a method of dicing the semiconductor wafer, corresponding to operation 104 of the Flowchart of FIG. 1, in accordance with an embodiment of the present invention.
Figure 2C:
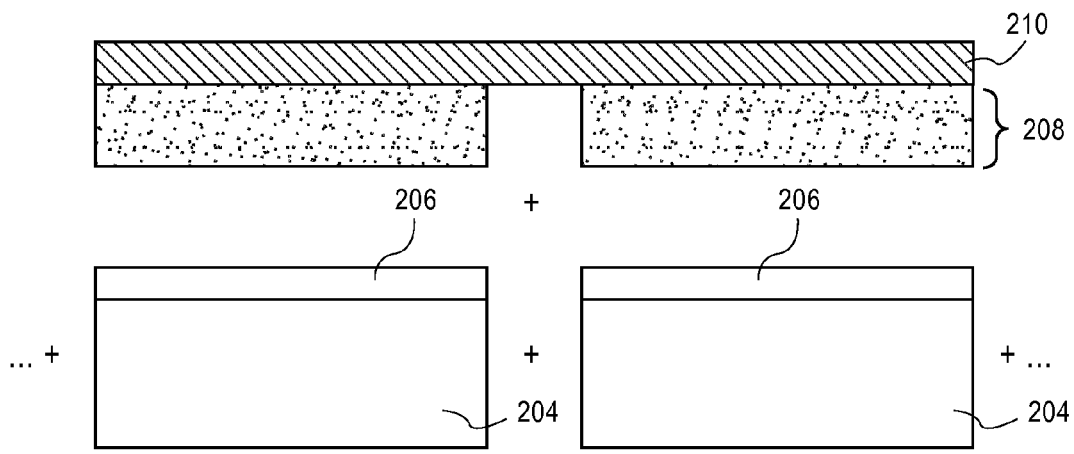
FIG. 2C illustrates a cross-sectional view of a semiconductor wafer including a plurality of integrated circuits during performing of a method of dicing the semiconductor wafer, corresponding to operations 106 and 108 of the Flowchart of FIG. 1, in accordance with an embodiment of the present invention.

FIG. 1 is a Flowchart 100 representing operations in a method of dicing a semiconductor wafer including a plurality of integrated circuits, in accordance with an embodiment of the present invention. FIGS. 2A-2C illustrate cross-sectional views of a semiconductor wafer including a plurality of integrated circuits during performing of a method of dicing the semiconductor wafer, corresponding to operations of Flowchart 100, in accordance with an embodiment of the present invention.

Referring to operation 102 of Flowchart 100, and corresponding FIG. 2A, a mask 202 is formed above a semiconductor wafer or substrate 204. The mask 202 covers and protects integrated circuits 206 formed on the surface of semiconductor wafer 204. The mask 202 also covers intervening streets 207 formed between each of the integrated circuits 206.

In accordance with an embodiment of the present invention, the mask 202 is a physically-removable mask. The physically-removable mask may be suitable for withstanding a laser and etch singulation process. For example, in one embodiment, the physically-removable mask 202 is suitable to withstand etching of an underlying stack having a thickness up to approximately 300 microns. In one embodiment, the physically-removable mask 202 is suitable to undergo a clean laser ablation process to pattern the mask, yet withstand a subsequent plasma etch process, as described below. In an embodiment, the physically-removable mask 202 is either photo-sensitive or photo-insensitive. In one such embodiment, the physically-removable mask 202 is a polymer. In a specific example, a photo-sensitive material is preferred over a photo-insensitive for laser-materials interactions.

In an embodiment, semiconductor wafer or substrate 204 is composed of a material suitable to withstand a fabrication process and upon which semiconductor processing layers may suitably be disposed. For example, in one embodiment, semiconductor wafer or substrate 204 is composed of a group IV-based material such as, but not limited to, crystalline silicon, germanium or silicon/germanium. In a specific embodiment, providing semiconductor wafer 204 includes providing a monocrystalline silicon substrate. In a particular embodiment, the monocrystalline silicon substrate is doped with impurity atoms. In another embodiment, semiconductor wafer or substrate 204 is composed of a III-V material such as, e.g., a III-V material substrate used in the fabrication of light emitting diodes (LEDs).

In an embodiment, semiconductor wafer or substrate 204 has disposed thereon or therein, as a portion of the integrated circuits 206, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 206. Conductive bumps and/or passivation layers may be formed above the interconnects layers. Materials making up the streets 207 may be similar to or the same as those materials used to form the integrated circuits 206. For example, streets 207 may be composed of layers of dielectric materials, semiconductor materials, and metallization. In one embodiment, one or more of the streets 207 includes test devices similar to the actual devices of the integrated circuits 206.

Referring to operation 104 of Flowchart 100, and corresponding FIG. 2B, the mask 202 is patterned with a laser scribing process to provide a patterned mask 208 with gaps 210, exposing regions of the semiconductor wafer or substrate 204 between the integrated circuits 206. As such, the laser scribing process is used to remove the material of the streets 207 originally formed between the integrated circuits 206. In accordance with an embodiment of the present invention, patterning the mask 202 with the laser scribing process includes forming trenches 212 partially into the regions of the semiconductor wafer 204 between the integrated circuits 206, as depicted in FIG. 2B.

In an embodiment, patterning the mask 202 with the laser scribing process includes using a laser having a pulse width in the femtosecond range. Specifically, a laser based on light falling in the visible spectrum or the ultra-violet (UV) or infra-red (IR) ranges (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 202, the streets 207 and, possibly, a portion of the semiconductor wafer or substrate 204.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 3 illustrates a cross-sectional view of a stack of materials that may be used in a street region of a semiconductor wafer or substrate, in accordance with an embodiment of the present invention.

Figure 3:
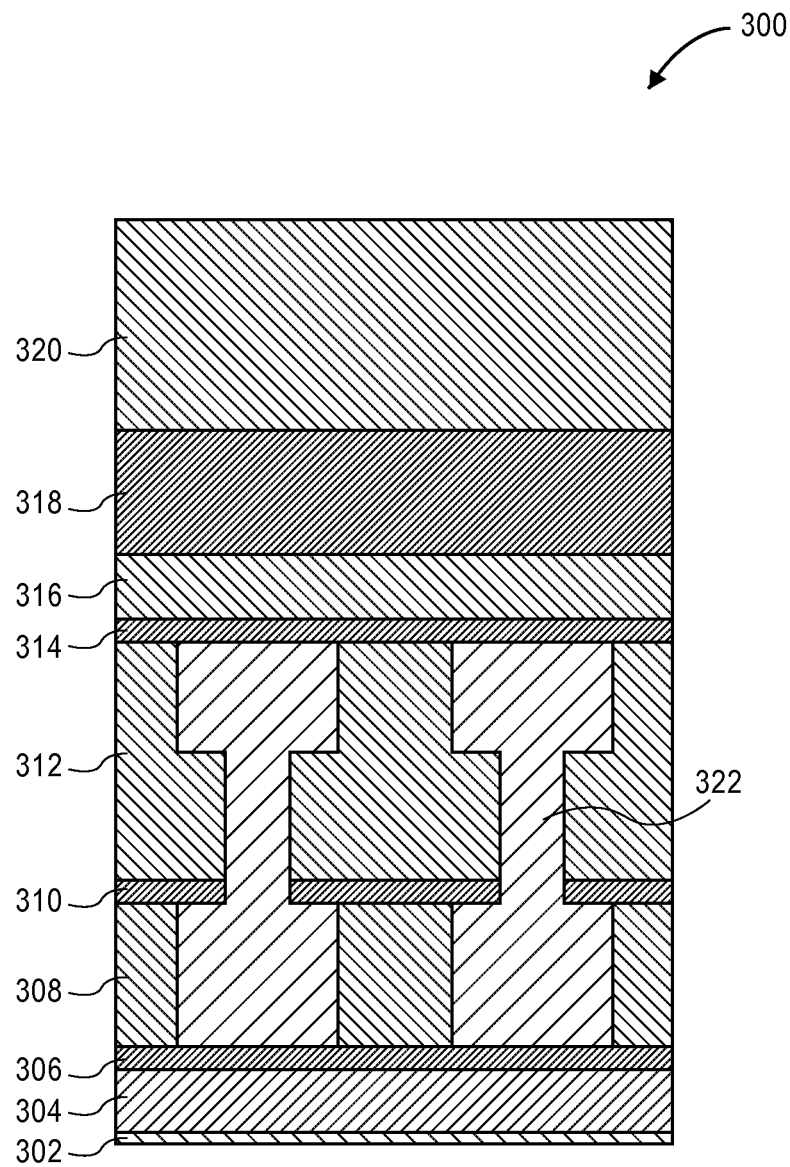
FIG. 3 illustrates a cross-sectional view of a stack of materials that may be used in a street region of a semiconductor wafer or substrate, in accordance with an embodiment of the present invention.

Referring to FIG. 3, a street region 300 includes the top portion 302 of a silicon substrate, a first silicon dioxide layer 304, a first etch stop layer 306, a first low K dielectric layer 308 (e.g., having a dielectric constant of less than the dielectric constant of 4.0 for silicon dioxide), a second etch stop layer 310, a second low K dielectric layer 312, a third etch stop layer 314, an undoped silica glass (USG) layer 316, a second silicon dioxide layer 318, and a layer of photo-resist 320, with relative thicknesses depicted. Copper metallization 322 is disposed between the first and third etch stop layers 306 and 314 and through the second etch stop layer 310. In a specific embodiment, the first, second and third etch stop layers 306, 310 and 314 are composed of silicon nitride, while low K dielectric layers 308 and 312 are composed of a carbon-doped silicon oxide material.

Under conventional laser irradiation (such as nanosecond-based or picosecond-based laser irradiation), the materials of street 300 may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of a physically-removable mask, a layer of silicon dioxide, a layer of low K material, and a layer of copper by ablating the physically-removable mask prior to ablating the layer of silicon dioxide, and then ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 106 of Flowchart 100, and corresponding FIG. 2C, the semiconductor wafer 204 is etched through the gaps 210 in the patterned mask 208 to form singulated integrated circuits 206. In accordance with an embodiment of the present invention, etching the semiconductor wafer 204 includes etching the trenches 212 formed with the laser scribing process to ultimately etch entirely through semiconductor wafer 204, as depicted in FIG. 2C.

In an embodiment, etching the semiconductor wafer 204 includes using a plasma etching process. In one embodiment, a through-silicon via type etch process is used. For example, in a specific embodiment, the etch rate of the material of semiconductor wafer 204 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 204 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally is a fluorine-based gas such as $SF_6$, $C_4F_8$, $CHF_3$, $XeF_2$, or any other reactant gas capable of etching silicon at a relatively fast etch rate.

Referring to operation 108 of Flowchart 100, and again to corresponding FIG. 2C, the patterned mask 208 is separated from the singulated integrated circuits 206. In one embodiment, a mask removal structure 210, such as an adhesive layer, is used to remove the patterned mask 208 from the singulated integrated circuits 206. In an embodiment, the patterned mask 208 is removed after the laser scribe and plasma etch portions of the singulation process, but prior to ultimate individualization from, e.g., a backing tape, as described in more detail below in association with FIGS. 4A-4F. In an embodiment, the separating is a mechanical separation distinguished from, e.g., a solution-dissolving removal of a mask layer.

Accordingly, referring again to Flowchart 100 and FIGS. 2A-2C, wafer dicing may be preformed by initial laser ablation through a physically-removable mask, through wafer streets (including metallization), and partially into a silicon substrate. The laser pulse width may be selected in the femtosecond range. Die singulation may then be completed by subsequent through-silicon deep plasma etching. The physically removable mask is then removed from the singulated integrated circuits. A specific example of a materials stack for dicing is described below in association with FIGS. 4A-4F, in accordance with an embodiment of the present invention.

Figure 4A:
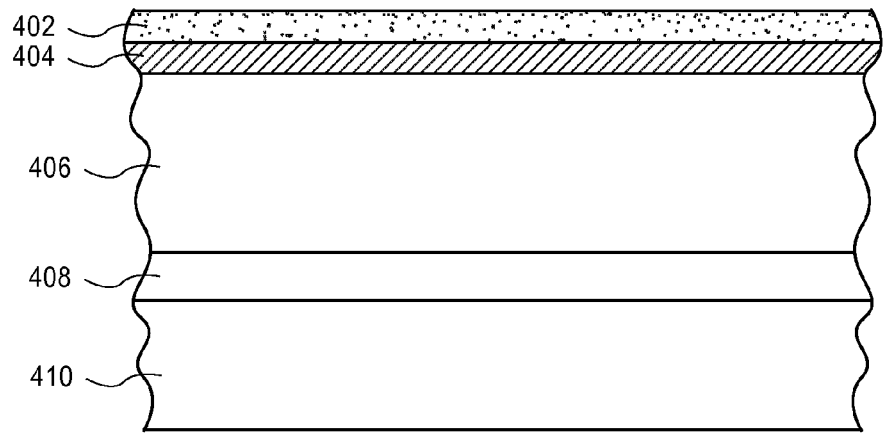
FIGS. 4A-4F illustrate cross-sectional views of various operations in a method of dicing a semiconductor wafer, in accordance with an embodiment of the present invention.

Referring to FIG. 4A, a materials stack for hybrid laser ablation and plasma etch dicing includes a physically-removable mask 402, a device layer 404, and a substrate 406. The physically-removable mask 402, device layer 404, and substrate 406 are disposed above a die attach film 408 which is affixed to a backing tape 410. In an embodiment, the device layer 404 includes an inorganic dielectric layer (such as silicon dioxide) disposed above one or more metal layers (such as copper layers) and one or more low K dielectric layers (such as carbon-doped oxide layers). The device layer 404 may also include streets arranged between integrated circuits, the streets including the same or similar layers to the integrated circuits. In an embodiment, the substrate 406 is a bulk single-crystalline silicon substrate.

In an embodiment, the physically-removable mask 402 is a thin polymer sheet (e.g., in the form of a film or tape) applied by placing or rolling the sheet onto the device layer 404. In one such embodiment, the thin polymer sheet has a sufficiently high adhesion to the device layer 404 to withstand a laser scribing and subsequent plasma etch process, but has a sufficiently low adhesion for subsequent physical removal by a stronger adhesive layer. In one embodiment, the thin polymer sheet includes a layer of polyvinyl alcohol disposed on the device layer 404. In one embodiment, the thin polymer sheet is sufficiently transparent for aligning streets of the wafer or substrate with a laser ablation process. In one embodiment, the thin polymer sheet has a thickness of or less than approximately 50 microns, e.g., approximately 20 microns. In one embodiment, the thin polymer sheet is secured to the device layer 404 by a frame cover used to carrier the wafer or substrate 406.

In another embodiment, the physically-removable mask 402 is composed of a spin-on layer, such as a photo-resist layer. For example, in one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In one embodiment, the photo-resist layer is composed of a negative photo-resist material such as, but not limited to, poly-cis-isoprene and poly-vinyl-cinnamate.

In an embodiment, the bulk single-crystalline silicon substrate 406 is thinned from the backside prior to being affixed to the die attach film 408. In one such embodiment, the thinning is performed after forming or disposing the physically-removable mask 402 above the device layer 404. However, in another such embodiment, the thinning is performed before forming or disposing the physically-removable mask 402 above the device layer 404. The thinning may be performed by a backside grind process. In one embodiment, the bulk single-crystalline silicon substrate 406 is thinned to a thickness approximately in the range of 50-100 microns. It is important to note that, in an embodiment, the thinning is performed prior to a laser ablation and plasma etch dicing process. In an embodiment, the device layer 404 has a thickness approximately in the range of 2-3 microns. In an embodiment, the die attach film 408 (or any suitable substitute capable of bonding a thinned or thin wafer or substrate to the backing tape 410) has a thickness of approximately 20 microns.

Figure 4B:
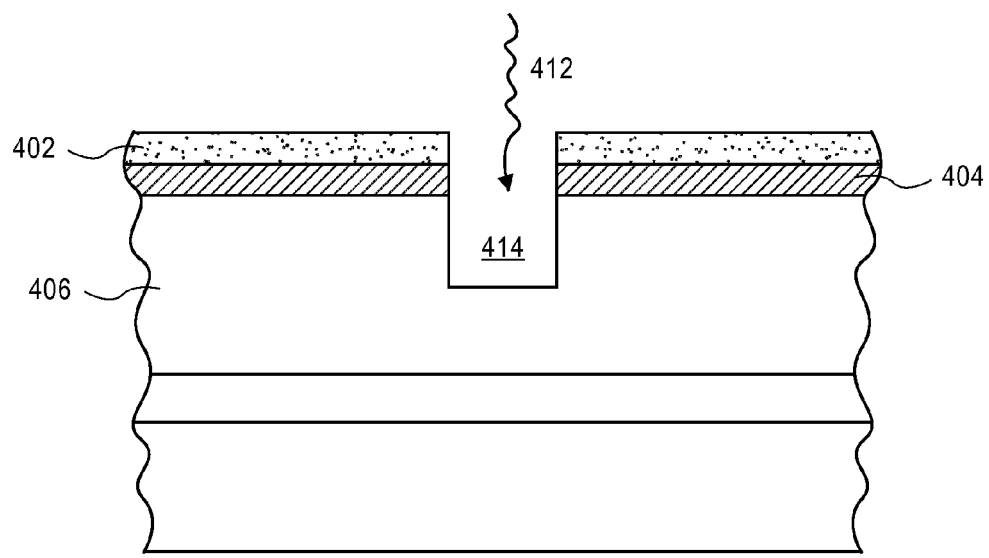

Referring to FIG. 4B, the physically-removable mask 402, the device layer 404 and a portion of the substrate 406 are patterned with a laser scribing process 412 to form trenches 414 in the substrate 406. In an embodiment, the laser scribing process 412 is a femtosecond-based laser scribing process 412. In an embodiment, the physically-removable mask 402 is cut through by the laser scribing process 412 and functions to carry debris generated by the laser scribing process 412.

Figure 4C:
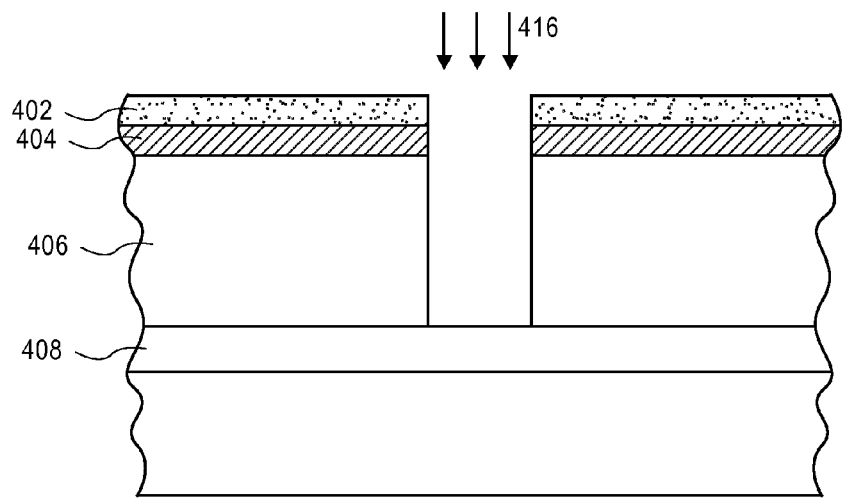

Referring to FIG. 4C, a through-silicon deep plasma etch process 416 is used to extend the trench 414 down to the die attach film 408, exposing the top portion of the die attach film 408 and singulating the silicon substrate 406. The device layer 404 is protected by the physically-removable mask 402 during the through-silicon deep plasma etch process 416.

Figure 4D:
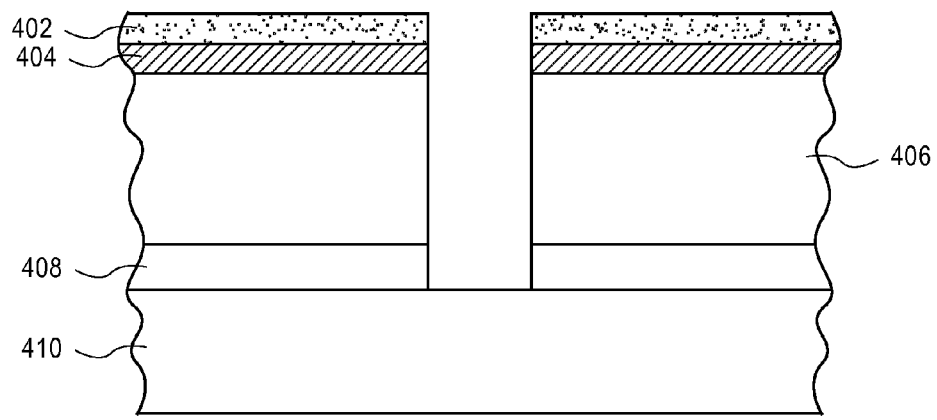

Referring to FIG. 4D, the singulation process may further include patterning the die attach film 408, exposing the top portion of the backing tape 410 and singulating the die attach film 408. In an embodiment, the die attach film is singulated by a laser process or by an etch process.

Figure 4E:
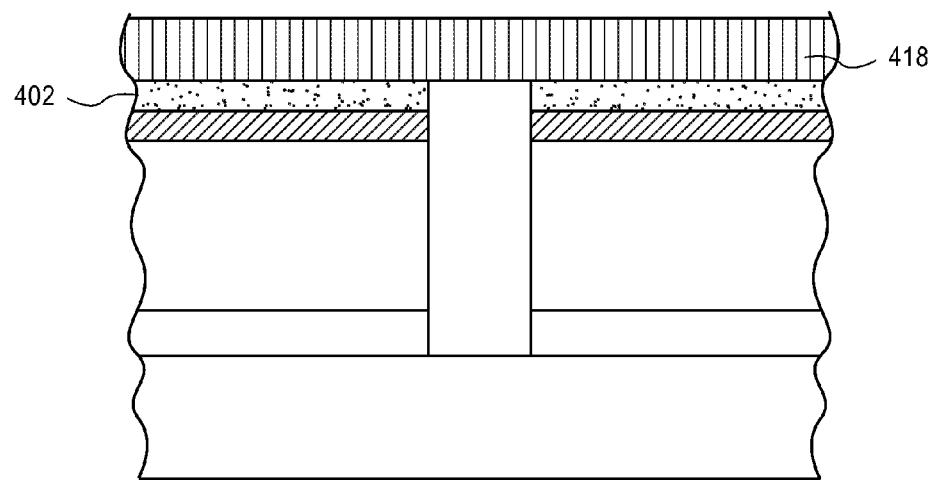

Referring to FIG. 4E, a removal structure 418 is disposed on the physically-removable mask 402. In an embodiment, the removal structure 418 is an adhesive layer. In one such embodiment, the compositions of the adhesive layer and of the physically-removable mask 402 are chosen to provide removal selectivity between the physically-removable mask 402 a polymer layer of device layer 404.

In an embodiment, the removal structure 418 is an adhesive tape layer such as, but not limited to, a flexible polyvinyl chloride (PVC) layer with synthetic acrylic adhesive bonded to one side, a polyolefin base film coated with an adhesive, an ultra-violet (UV)-curable dicing tape, a polyimide film tape with a silicone adhesive surface, or a wave solder tape having a poly-vinyl alcohol backing. In an embodiment, the removal structure 418 is applied to the physically-removable mask 402 by a Kapton film roll or a tape applicator.

Figure 4F:
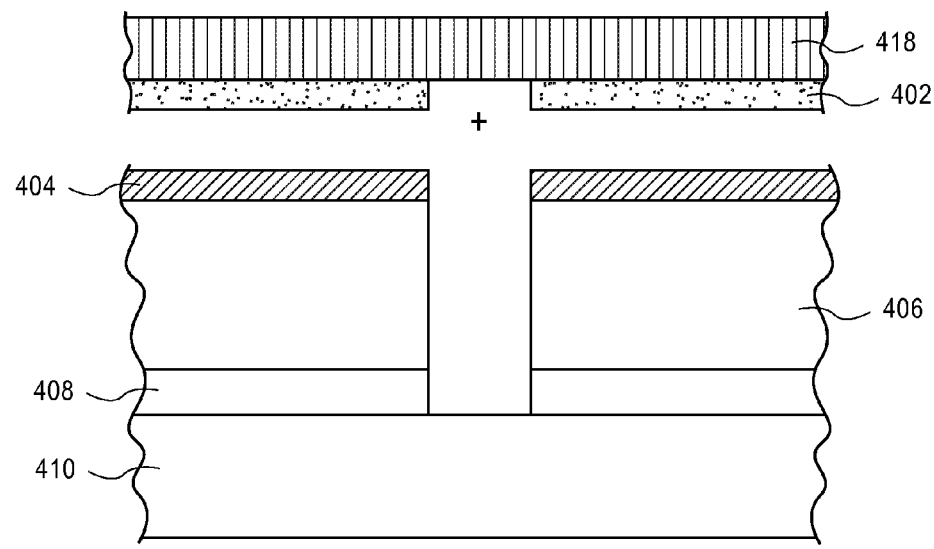

Referring to FIG. 4F, the physically-removable mask 402 is removed from the device layer 404 by adhesion to removal structure 418, exposing the device layer 404. In an embodiment, the removal structure 418 is an adhesive layer which adheres to physically-removable mask 402 to a greater extent than the physically-removable mask 402 adheres to device layer 404, facilitating removal of the physically-removable mask 402 from device layer 404. In a specific such embodiment, the adhesive layer is used to remove the physically-removable mask 402 from the device layer 404 by a lift-off, a roll-off, or a peel-off process. In an embodiment, the physically-removable mask 402 is removed from the device layer 404 without oxidizing or otherwise damaging a bumps layer or a passivation layer of the device layer 404. That is, the physically-removable mask 402 is removed without changing the properties of layers disposed there under. In an embodiment, the physically-removable mask 402 and removal structure 418 pairing is removed by the same process used to apply the removal structure 418 to the physically-removable mask 402. For example in one embodiment, the physically-removable mask 402 and removal structure 418 pairing is removed by a Kapton film roll or a tape applicator.

Further embodiments may include subsequently removing the singulated portions of substrate 406 (e.g., as individual integrated circuits) from the backing tape 410. In one embodiment, the singulated die attach film 408 is retained on the back sides of the singulated portions of substrate 406. In an alternative embodiment, in the case that substrate 406 is thinner than approximately 50 microns, the laser ablation process 412 is used to completely singulate substrate 406 without the use of an additional plasma process. In an embodiment, the singulated integrated circuits are removed from the backing tape 410 for packaging. In one such embodiment, the patterned die attach film 408 is retained on the backside of each integrated circuit and included in the final packaging. However, in another embodiment, the patterned die attach film 408 is removed during or subsequent to the singulation process.

Referring again to FIGS. 2A-2C, the plurality of integrated circuits 206 may be separated by streets 207 having a width of approximately 10 microns or smaller. The use of a femtosecond-based laser scribing approach, at least in part due to the tight profile control of the laser, may enable such compaction in a layout of integrated circuits. It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits. In an embodiment, the plurality of integrated circuits 206 may be arranged on semiconductor wafer or substrate 204 in a non-restricted or freeform layout.

A single process tool may be configured to perform many or all of the operations in a hybrid laser ablation and plasma etch singulation process including the use of a physically-removable mask. For example, FIG. 5 illustrates a block diagram of a tool layout for laser and plasma dicing of wafers or substrates, in accordance with an embodiment of the present invention.

Figure 5:
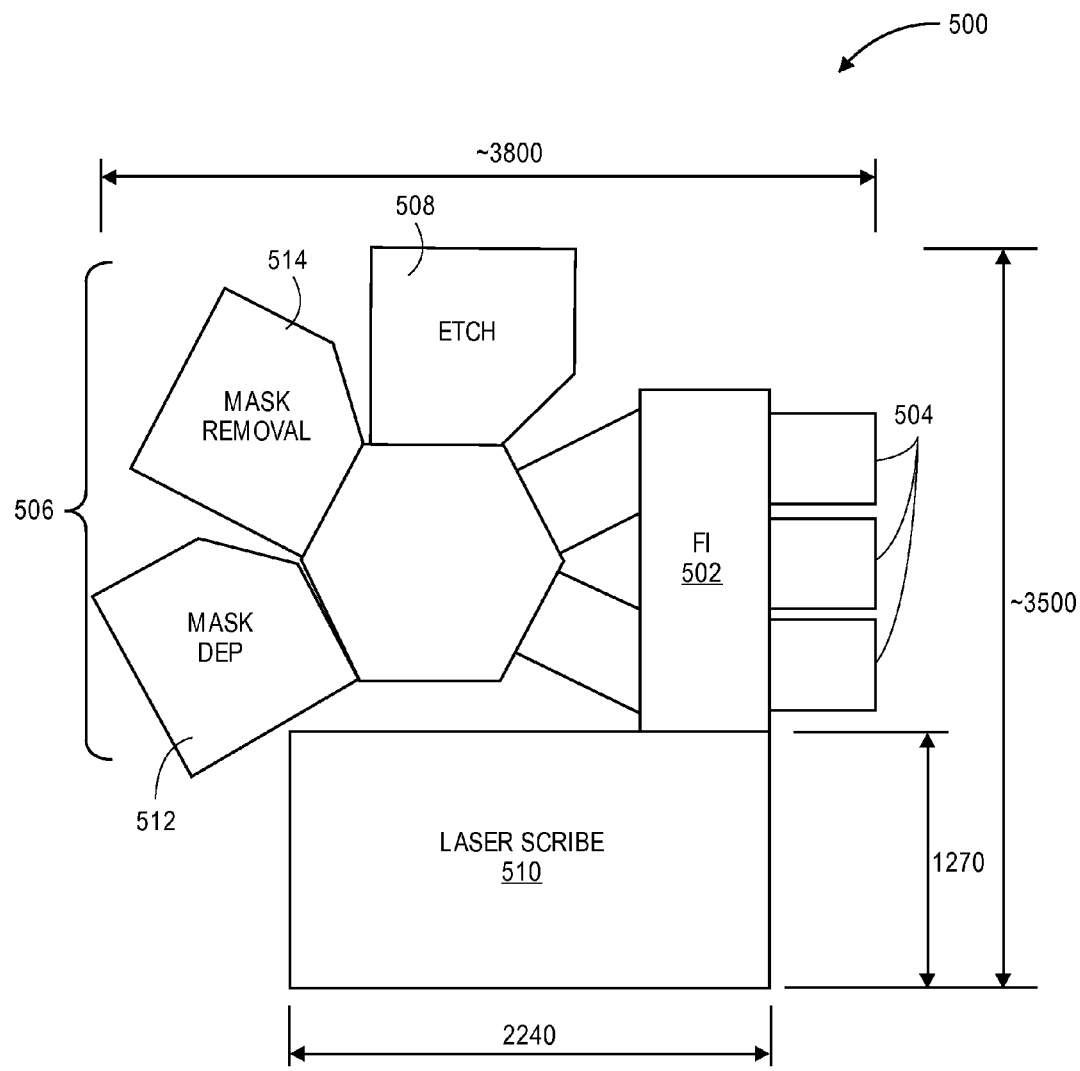
FIG. 5 illustrates a block diagram of a tool layout for laser and plasma dicing of wafers or substrates, in accordance with an embodiment of the present invention.

Referring to FIG. 5, a process tool 500 includes a factory interface 502 (FI) having a plurality of load locks 504 coupled therewith. A cluster tool 506 is coupled with the factory interface 502. The cluster tool 506 includes a plasma etch chamber 508. A laser scribe apparatus 510 is also coupled to the factory interface 502. The overall footprint of the process tool 500 may be, in one embodiment, approximately 3500 millimeters (3.5 meters) by approximately 3800 millimeters (3.8 meters), as depicted in FIG. 5.

In an embodiment, the laser scribe apparatus 510 houses a laser. In one such embodiment, the laser is a femtosecond-based laser. The laser is suitable for performing a laser ablation portion of a hybrid laser and etch singulation process including the use of a physically-removable mask, such as the laser ablation processes described above. In one embodiment, a moveable stage is also included in laser scribe apparatus 500, the moveable stage configured for moving a wafer or substrate (or a carrier thereof) relative to the laser. In a specific embodiment, the laser is also moveable. The overall footprint of the laser scribe apparatus 510 may be, in one embodiment, approximately 2240 millimeters by approximately 1270 millimeters, as depicted in FIG. 5.

In an embodiment, the plasma etch chamber 508 is configured for etching a wafer or substrate through the gaps in a patterned mask to singulate a plurality of integrated circuits. In one such embodiment, the plasma etch chamber 508 is configured to perform a deep silicon etch process. In a specific embodiment, the plasma etch chamber 508 is an Applied Centura® Silvia™ Etch system, available from Applied Materials of Sunnyvale, Calif., USA. The plasma etch chamber 508 may be specifically designed for a deep silicon etch used to create singulate integrated circuits housed on or in single crystalline silicon substrates or wafers. In an embodiment, a high-density plasma source is included in the plasma etch chamber 508 to facilitate high silicon etch rates. In an embodiment, more than one plasma etch chamber is included in the cluster tool 506 portion of process tool 500 to enable high manufacturing throughput of the singulation or dicing process.

The factory interface 502 may be a suitable atmospheric port to interface between an outside manufacturing facility with laser scribe apparatus 510 and cluster tool 506. The factory interface 502 may include robots with arms or blades for transferring wafers (or carriers thereof) from storage units (such as front opening unified pods) into either cluster tool 506 or laser scribe apparatus 510, or both.

Cluster tool 506 may include other chambers suitable for performing functions in a method of singulation. For example, in one embodiment, a physically-removable mask deposition chamber 512 is included. The physically-removable mask deposition chamber 512 may be configured for mask deposition on or above a device layer of a wafer or substrate prior to laser scribing of the wafer or substrate. In one such embodiment, the physically-removable mask deposition chamber 512 is suitable for disposing a mask by a roll-on process. In another such embodiment, the physically-removable mask deposition chamber 512 is suitable for forming a photo-resist layer.

In an embodiment, a mask removal station or chamber 514 is included for physical removal of a mask. In one such embodiment, the mask removal station or chamber 514 is configured to physically remove a mask from a device layer by a process such as, but not limited to, a lift-off, a roll-off, or a peel-off process.

In other embodiments, a wet/dry station may be included. The wet/dry station may be suitable for cleaning residues and fragments, or for removing a mask, subsequent to a laser scribe and plasma etch singulation process of a substrate or wafer. In an embodiment, a metrology station is also included as a component of process tool 500.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 500 described in association with FIG. 5. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
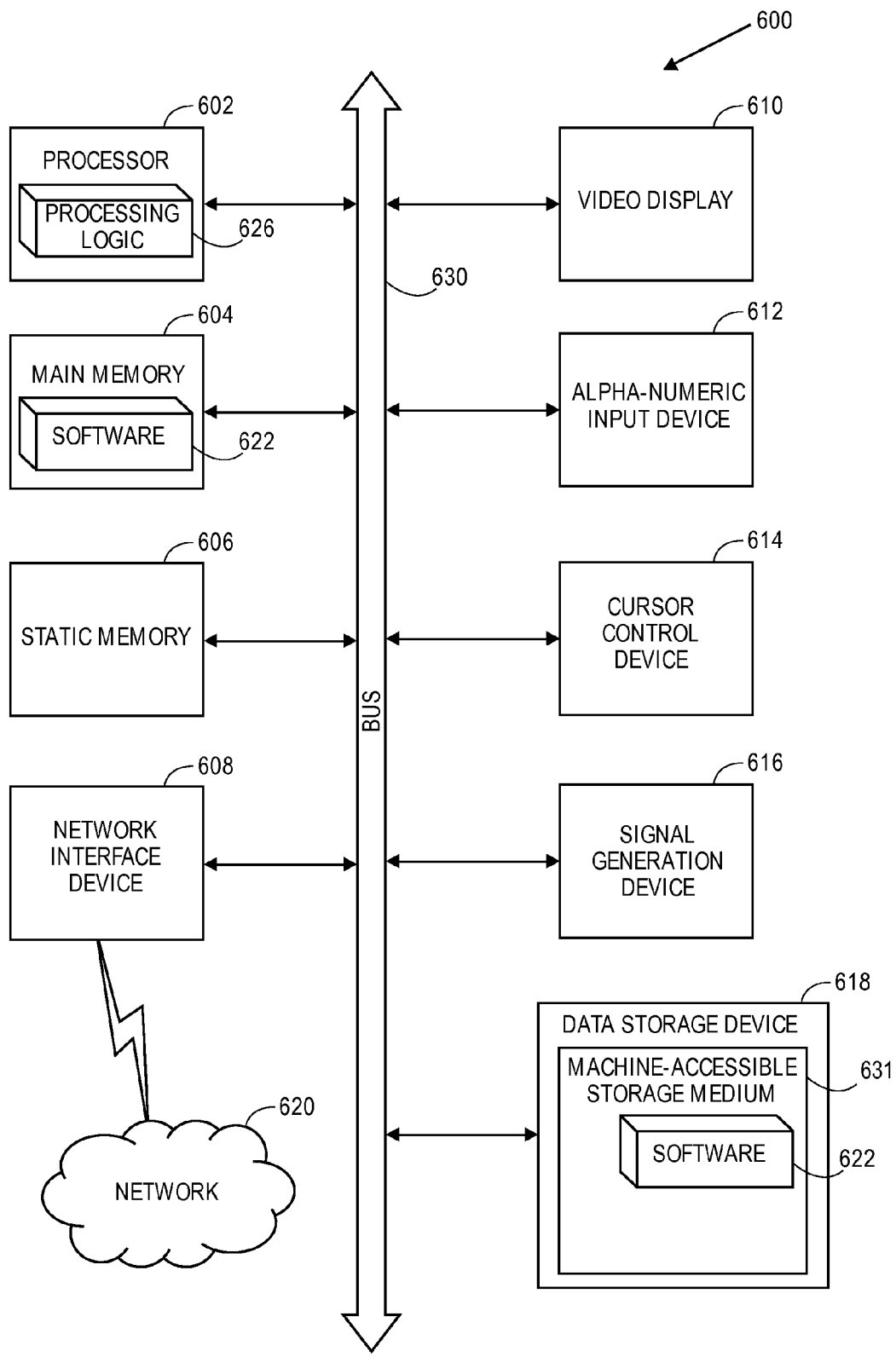
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method includes forming a mask above the semiconductor wafer, the mask covers and protects the integrated circuits. The mask is then patterned with a laser scribing process to provide a patterned mask with gaps. Regions of the semiconductor wafer are exposed between the integrated circuits. The semiconductor wafer is then etched through the gaps in the patterned mask to form singulated integrated circuits. The patterned mask is then separated from the singulated integrated circuits.

Thus, methods of dicing semiconductor wafers, each wafer having a plurality of integrated circuits, have been disclosed. In accordance with an embodiment of the present invention, a method includes dicing a semiconductor wafer having a plurality of integrated circuits includes forming a mask above the semiconductor wafer, the mask covers and protects the integrated circuits. The method also includes patterning the mask with a laser scribing process to provide a patterned mask with gaps, exposing regions of the semiconductor wafer between the integrated circuits. The method also includes etching the semiconductor wafer through the gaps in the patterned mask to form singulated integrated circuits. The method also includes separating the patterned mask from the singulated integrated circuits. In one embodiment, forming the mask above the semiconductor wafer includes forming a mask suitable to withstand a high density plasma etching process. In one embodiment, separating the patterned mask from the singulated integrated circuits includes physically removing by a process such as, but not limited to, a lift-off process, a roll-off process, or a peel-off process.

What is claimed is:

1. A method of dicing a semiconductor wafer comprising a front surface having a plurality of integrated circuits thereon and having a back surface opposite the front surface, the method comprising:
   forming an outermost mask on the front surface of the semiconductor wafer, the outermost mask covering and protecting the integrated circuits;
   patterning the outermost mask and a portion of the semiconductor wafer with a laser scribing process to provide a patterned outermost mask and to form trenches partially into but not through the semiconductor wafer between the integrated circuits, each of the trenches having a width;
   plasma etching, with the patterned outermost mask exposed, the semiconductor wafer through the trenches to form corresponding trench extensions and to form singulated integrated circuits, each of the corresponding trench extensions having the width; and
   separating the patterned outermost mask from the singulated integrated circuits.

2. The method of claim 1, wherein forming the outermost mask comprises adhering a thin polymer sheet to the integrated circuits.

3. The method of claim 2, wherein the thin polymer sheet is transparent to the integrated circuits and has a thickness approximately equal to or less than 50 microns.

4. The method of claim 1, wherein forming the outermost mask comprises depositing a photo-resist layer on the integrated circuits.

5. The method of claim 1, wherein separating the patterned outermost mask from the singulated integrated circuits comprises physically removing the patterned outermost mask by a process selected from the group consisting of a lift-off process, a roll-off process, or a peel-off process.

6. The method of claim 1, wherein patterning the outermost mask and the portion of the semiconductor wafer with the laser scribing process comprises patterning with a femtosecond-based laser scribing process.

7. The method of claim 1, wherein forming the outermost mask above the semiconductor wafer comprises forming an outermost mask suitable to withstand a high density plasma etching process.

8. A method of dicing a silicon substrate comprising a front surface having a plurality of integrated circuits thereon and having a back surface opposite the front surface:
   forming a physically-removable outermost mask on the front surface of the silicon substrate, the physically-removable outermost mask covering and protecting the integrated circuits, the integrated circuits comprising a layer of silicon dioxide disposed above a layer of low K material and a layer of copper;
   patterning the physically-removable outermost mask, the layer of silicon dioxide, the layer of low K material, the layer of copper, and a portion of the silicon substrate with a laser scribing process to form trenches partially into but not through regions of the silicon substrate between the integrated circuits, each of the trenches having a width;
   plasma etching, from the front surface of the silicon substrate, the silicon substrate through the trenches to form corresponding trench extensions and to form singulated integrated circuits, each of the corresponding trench extensions having the width; and
   separating the physically-removable outermost mask from the singulated integrated circuits.

9. The method of claim 8, wherein patterning the physically-removable outermost mask, the layer of silicon dioxide, the layer of low K material, the layer of copper, and the portion of the silicon substrate with the laser scribing process comprises ablating the physically-removable outermost mask prior to ablating the layer of silicon dioxide, and ablating the layer of silicon dioxide prior to ablating the layer of low K material and the layer of copper.

10. The method of claim 8, wherein forming the physically-removable outermost mask comprises adhering a thin polymer sheet to the integrated circuits.

11. The method of claim 10, wherein the thin polymer sheet is transparent to the integrated circuits and has a thickness approximately equal to or less than 50 microns.

12. The method of claim 8, wherein forming the physically-removable outermost mask comprises depositing a photo-resist layer on the integrated circuits.

13. The method of claim 8, wherein separating the physically-removable outermost mask from the singulated integrated circuits comprises physically removing the physically-removable outermost mask by a process selected from the group consisting of a lift-off process, a roll-off process, or a peel-off process.

14. The method of claim 8, wherein patterning the physically-removable outermost mask with the laser scribing process comprises patterning with a femtosecond-based laser scribing process.

15. The method of claim 8, wherein forming the physically-removable outermost mask above the silicon substrate comprises forming an outermost mask suitable to withstand a high density plasma etching process.

* * * * *